United States Patent
Yu et al.

(10) Patent No.: US 12,407,145 B2
(45) Date of Patent: Sep. 2, 2025

(54) VERTICAL CAVITY SURFACE EMITTING LASER DEVICE WITH AT LEAST ONE BONDING LAYER

(71) Applicant: Lumentum Operations LLC, San Jose, CA (US)

(72) Inventors: Qianhuan Yu, Santa Clara, CA (US); Ajit Vijay Barve, San Jose, CA (US)

(73) Assignee: Lumentum Operations LLC, San Jose, CA (US)

( * ) Notice: Subject to any disclaimer, the term of this patent is extended or adjusted under 35 U.S.C. 154(b) by 776 days.

(21) Appl. No.: 17/449,365

(22) Filed: Sep. 29, 2021

(65) Prior Publication Data

US 2022/0416506 A1 Dec. 29, 2022

Related U.S. Application Data (60) Provisional application No. 63/213,939, filed on Jun. 23, 2021.

(51) Int. Cl.
| | |
|---|---|
| H01S 5/183 | (2006.01) |
| H01S 5/02 | (2006.01) |
| H01S 5/042 | (2006.01) |
| H01S 5/343 | (2006.01) |

(52) U.S. Cl.
CPC ........ *H01S 5/18377* (2013.01); *H01S 5/0206* (2013.01); *H01S 5/0421* (2013.01); *H01S 5/18308* (2013.01); *H01S 5/34306* (2013.01)

(58) Field of Classification Search
CPC . H01S 5/18361; H01S 5/1838; H01S 5/34306
See application file for complete search history.

(56) References Cited

U.S. PATENT DOCUMENTS

| | | | | |
|---|---|---|---|---|
| 5,835,521 | A * | 11/1998 | Ramdani | H01S 5/1838 372/96 |
| 9,281,446 | B2 * | 3/2016 | Suh | H01L 33/0025 |
| 10,714,893 | B2 * | 7/2020 | Jayaraman | H01S 5/1838 |
| 11,611,195 | B2 * | 3/2023 | Berk | H01S 5/18316 |
| 2007/0091958 | A1 * | 4/2007 | Miyachi | H01S 5/4043 372/50.122 |
| 2021/0175687 | A1 * | 6/2021 | Kimura | H01S 5/18341 |

OTHER PUBLICATIONS

Chua, "Dielectrically-Bonded Long Wavelength Vertical Cavity Laser on GaAs Substrates Using Strain-Compensated Multiple Quantum Wells", Dec. 1994, IEEE Photonics Letters, vol. 6, No. 12, p. 1400-1402. (Year: 1994).*

* cited by examiner

*Primary Examiner* — Michael Carter
(74) *Attorney, Agent, or Firm* — Harrity & Harrity, LLP (57) ABSTRACT

In some implementations, a vertical cavity surface emitting laser (VCSEL) device includes a substrate; a first mirror disposed over the substrate; a bonding layer disposed over the first mirror; and an active region disposed over the bonding layer. The substrate is a gallium arsenide (GaAs) substrate, and the active region is an indium phosphide (InP)-based active region.

20 Claims, 4 Drawing Sheets

VERTICAL CAVITY SURFACE EMITTING LASER DEVICE WITH AT LEAST ONE BONDING LAYER

RELATED APPLICATION

This application claims priority to U.S. Provisional Patent Application No. 63/213,939, entitled "VERTICAL CAVITY SURFACE EMITTING LASER WITH AT LEAST ONE SU-8 BONDING LAYER," filed on Jun. 23, 2021, the content of which is incorporated by reference herein in its entirety.

TECHNICAL FIELD

The present disclosure relates generally to a vertical cavity surface emitting laser (VCSEL) device and to a VCSEL device with at least one bonding layer.

BACKGROUND

A vertical-emitting laser device, such as a VCSEL, is a laser in which a beam is emitted in a direction perpendicular to a surface of a substrate (e.g., vertically from a surface of a semiconductor wafer). Multiple vertical-emitting devices may be arranged in an array with a common substrate.

SUMMARY

In some implementations, a VCSEL device includes a substrate; a first mirror disposed over the substrate; a bonding layer disposed over the first mirror; and an active region disposed over the bonding layer, wherein: the substrate is a gallium arsenide (GaAs) substrate, and the active region is an indium phosphide (InP)-based active region.

In some implementations, a die includes a GaAs substrate; and a plurality of individual epitaxial structures disposed on the substrate, wherein each epitaxial structure, of the plurality of individual epitaxial structures, comprises: a first mirror disposed over the substrate; a bonding layer disposed over the first mirror; and an InP-based active region disposed over the bonding layer.

In some implementations, a method of forming a VCSEL device includes forming a first epitaxial substructure on a GaAs substrate; forming a second epitaxial substructure on an InP substrate; attaching, using a bonding layer, the first epitaxial substructure to the second epitaxial substructure to form an epitaxial structure; and removing the InP substrate from the epitaxial structure.

DETAILED DESCRIPTION

The following detailed description of example implementations refers to the accompanying drawings. The same reference numbers in different drawings may identify the same or similar elements.

A short-wave infrared (SWIR) vertical cavity surface emitting laser (VCSEL) device is configured to emit an output beam (e.g., an output laser beam) that has a wavelength in a near-infrared range (e.g., the wavelength of the output beam is in a range of 1200-1600 nanometers). Typically, a SWIR VCSEL includes a pair of reflectors (e.g., a pair of distributed Bragg reflectors (DBRs)) and an active region disposed between the pair of reflectors. The pair of reflectors and the active region may be formed over a substrate.

In many cases, an active region that comprises indium phosphide (InP) and that is grown on an InP substrate provides a desired optical gain (e.g., a high optical gain) for a SWIR VCSEL. However, due to a low index contrast for InP-based DBRs grown on an InP substrate, achieving a high reflectivity for DBRs that are monolithically grown on an InP substrate (e.g., with an InP-based active region) is challenging. This detrimentally impacts an optical performance of the SWIR VCSEL.

Further, in some cases a SWIR VCSEL can be formed using a conventional wafer fusion process. However, the conventional wafer fusion process requires specialized equipment that can apply high temperatures (e.g., greater than 200 degrees Celsius). Moreover, the conventional wafer fusion process is complex, which, in some cases, creates low quality layers and/or structures within the SWIR VCSEL. This introduces defects or allows defects to propagate through the SWIR VCSEL. This can degrade a performance, manufacturability, and/or a reliability of the SWIR VCSEL.

Some implementations described herein provide a VCSEL device (e.g., a SWIR VCSEL device) that includes a bonding layer that is configured to bond a first mirror (e.g., a non-InP-based mirror) to an InP-based active region. In some implementations, the VCSEL device includes an additional bonding layer that is configured to bond the InP-based active region to a second mirror (e.g., a non-InP-based mirror). In this way, the VCSEL device includes mirrors (e.g., gallium arsenide and/or aluminum gallium arsenide (GaAs/AlGaAs)-based DBRs) that have a high index contrast and therefore provide an increased reflectivity as compared to InP-based DBRs grown on an InP substrate. Further, the bonding layer and the additional bonding layer each comprise a polymer (e.g., an SU-8 photoresist polymer or a benzocyclobutene (BCB) polymer), or a similar material, that is transparent for light with wavelengths less than or equal to 1600 nanometers. The bonding layer and the additional bonding layer therefore do not impact an optical performance of the VCSEL device. Thus, the VCSEL device has an improved optical performance as compared to a typical SWIR VCSEL.

Some implementations described herein provide a multistage process for forming the VCSEL device. The multistage process includes forming a first epitaxial substructure on a GaAs substrate; forming a second epitaxial substructure on an InP substrate; attaching, using a bonding layer, the first epitaxial substructure to the second epitaxial substructure to form an epitaxial structure; and removing the InP substrate from the epitaxial structure. The first epitaxial substructure includes a first mirror (e.g., a first non-InP-based mirror), and the second epitaxial substructure includes an InP-based active region. In some implementations, the multistage process includes forming, after removing the InP substrate from the epitaxial structure, an additional bonding layer on a surface of the epitaxial structure, and forming a second mirror (e.g., a second non-InP-based mirror) on a surface of the additional bonding layer.

In this way, using a multistage process enables formation of high-quality layers and/or structures of independent epitaxial substructures. Further, forming and/or using the bonding layer to attach the first independent epitaxial substructure to the second epitaxial substructure is a low temperature process (e.g., less than or equal to 200 degrees Celsius), which decreases a likelihood that one or more layers of the first independent epitaxial substructure and/or the second epitaxial substructure are damaged during the attachment process. Accordingly, the multistage process enables formation of high-quality layers and/or structures within the VCSEL device, which reduces a likelihood of defects or of a propagation of defects through the VCSEL device. Therefore, using a multistage process to form a VCSEL device improves a performance, manufacturability, and/or a reliability of the VCSEL device, as compared to a typical SWIR VCSEL formed using a conventional wafer fusion process.

Figure 1A:
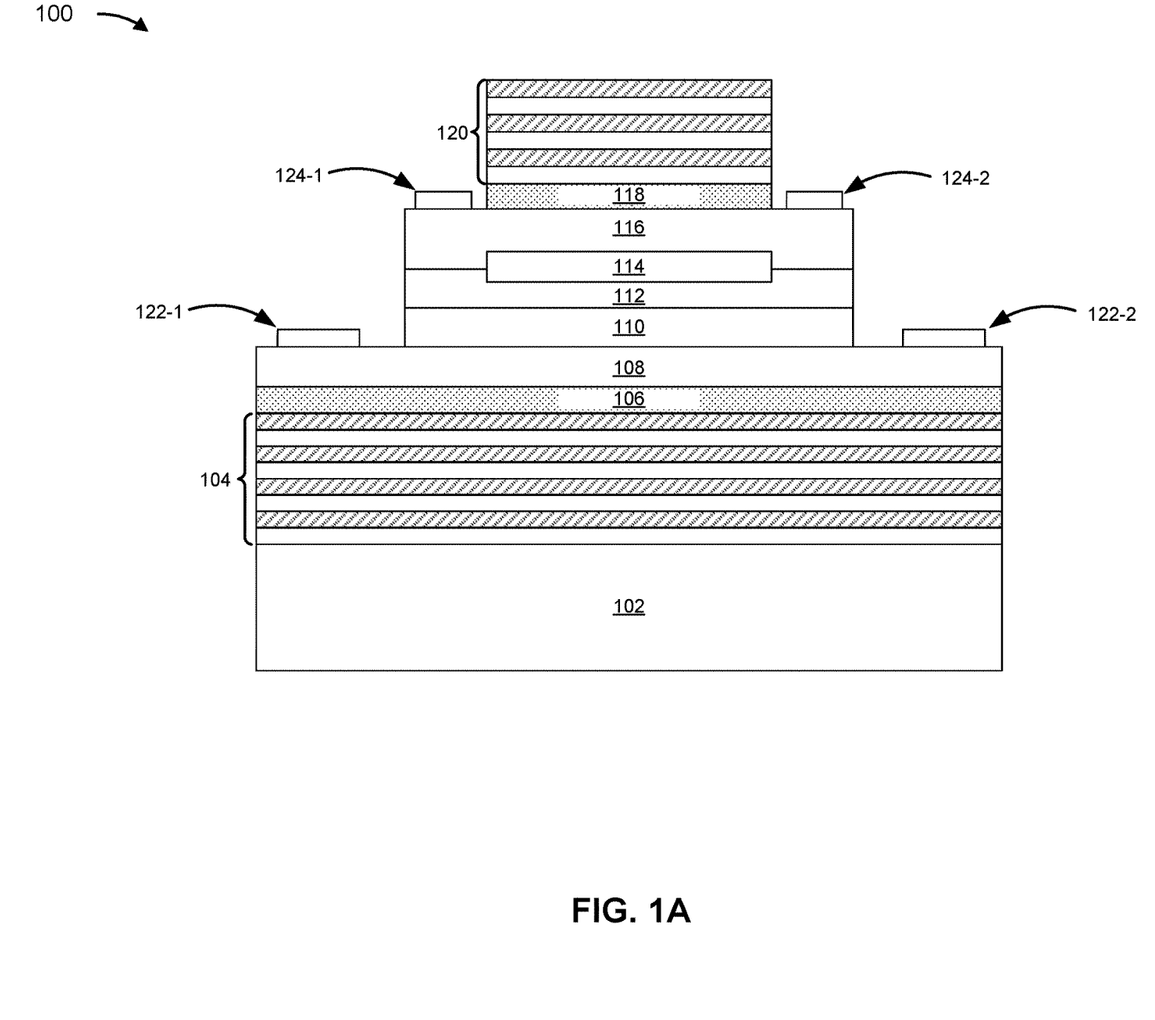
FIGS. 1A-1B are diagrams of different configurations of an example VCSEL device described herein.
Figure 1B:
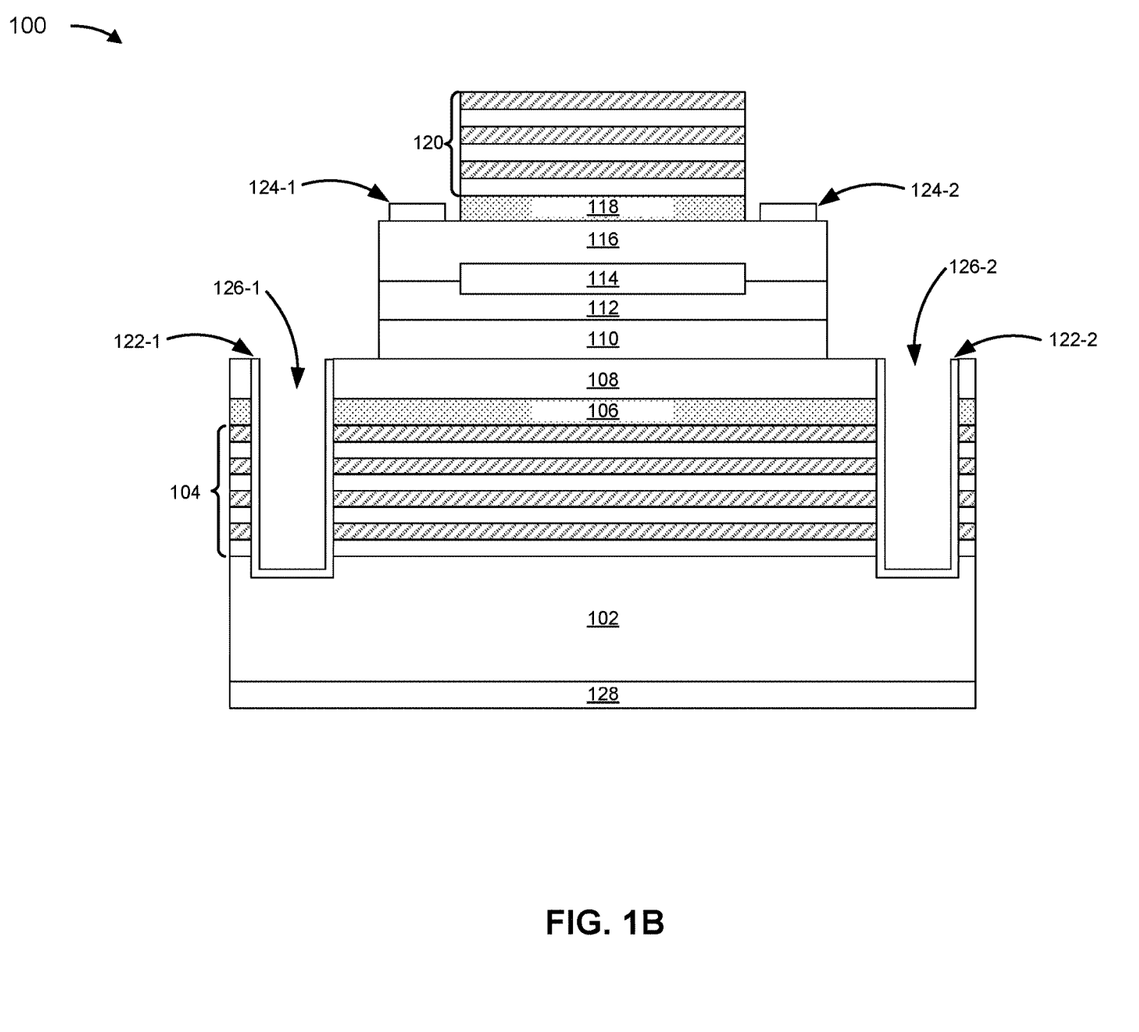

FIGS. 1A-1B are diagrams of different configurations of an example VCSEL device 100 described herein. The VCSEL device 100 may include, for example, a SWIR VCSEL device, an oxide confined VCSEL device, an implant confined VCSEL device, a mesa confined VCSEL device, a top emitting VCSEL device, or a bottom emitting VCSEL device. In some implementations, the VCSEL device 100 may be configured to emit an output beam (e.g., an output laser beam). For example, the device may be configured to emit an output beam that has a wavelength in a near-infrared range (e.g., the wavelength of the output beam is in a range of 1200-1600 nanometers).

In a first example configuration, as shown in FIG. 1A, the VCSEL device 100 may include a substrate 102, a first mirror 104, a bonding layer 106, a first n-type layer 108, an active region 110, a p-type layer 112, a tunnel junction 114, a second n-type layer 116, an additional bonding layer 118, a second mirror 120, a set of first contacts 122 (shown in FIG. 1B as first contacts 122-1 and 122-2), and/or a set of second contacts 124 (shown in FIG. 1B as second contacts 124-1 and 124-2).

The substrate 102 may include a substrate upon which other layers and/or structures shown in FIG. 1 are formed. The substrate 102 may include a semiconductor material, such as GaAs, InP, germanium (Ge), and/or another type of semiconductor material. In some implementations, the substrate 102 may be an n-doped substrate, such as an n-type GaAs substrate, an n-type InP substrate, or an n-type Ge substrate.

The first mirror 104 may be disposed over the substrate 102. For example, the first mirror 104 may be disposed on (e.g., directly on) a surface of the substrate 102 or on one or more intervening layers or structures (e.g., one or more spacers, one or more cladding layers, and/or other examples) between the substrate 102 and the first mirror 104. The first mirror 104 may include a reflector, such as a dielectric DBR or a semiconductor DBR. For example, the first mirror 104 may include a set of alternating semiconductor layers, such as a set of alternating GaAs layers and aluminum gallium arsenide (AlGaAs) layers or a set of alternating AlGaAs layers with different percentages of aluminum (Al) (e.g., AlGaAs layers with a low Al percentage and AlGaAs layers with a high Al percentage). In some implementations, the first mirror 104 may be an n-doped mirror (e.g., an n-doped DBR). For example, the first mirror 104 may include a set of alternating n-doped GaAs (n-GaAs) layers and n-doped AlGaAs (n-AlGaAs) layers or a set of alternating n-doped AlGaAs layers with a low Al percentage (low Al n-AlGaAs) and n-doped AlGaAs layers with a high Al percentage (high Al n-AlGaAs).

The bonding layer 106 may be disposed over the first mirror 104. For example, the bonding layer 106 may be disposed on (e.g., directly on) a surface of the first mirror 104 or on one or more intervening layers or structures (e.g., one or more spacers, one or more cladding layers, and/or other examples) between the first mirror 104 and the bonding layer 106. The bonding layer 106 may comprise, for example, at least one of a polymer, such as an SU-8 photoresist polymer or a BCB polymer; a metal material; or a silicon dioxide ($SiO_2$) material. In some implementations, a thickness of the bonding layer 106 may be between a particular thickness range. For example, the thickness of the bonding layer 106 may be between 10 nanometers and 1.6 micrometers (e.g., greater than or equal to 10 nanometers and less than or equal to 1.6 micrometers). In some implementations, the bonding layer 106 may be configured to bond the first mirror 104 to the first n-type layer 108 or, alternatively, to the active region 110 (e.g., when the first n-type layer 108 is not present in the VCSEL device 100).

The first n-type layer 108 may be disposed over the bonding layer 106. For example, the first n-type layer 108 may be disposed on (e.g., directly on) a surface of the bonding layer 106 or on one or more intervening layers or structures (e.g., one or more spacers, one or more cladding layers, and/or other examples) between the bonding layer 106 and the first n-type layer 108. The first n-type layer 108 may comprise, for example, at least one n-doped semiconductor layer, such as an n-doped InP (n-InP) layer.

The active region 110 may be disposed over the first n-type layer 108 and/or the bonding layer 106. For example, the active region 110 may be disposed on (e.g., directly on) a surface of the first n-type layer 108 or on one or more intervening layers (e.g., one or more spacers, one or more cladding layers, and/or other examples) between the first n-type layer 108 and the active region 110. As an alternative example, when the first n-type layer 108 is not present in the VCSEL device, the active region 110 may be disposed on (e.g., directly on) a surface of the bonding layer 106 or on one or more intervening layers (e.g., one or more spacers, one or more cladding layers, and/or other examples) between the bonding layer 106 and the active region 110. The active region 110 may include one or more layers where electrons and holes recombine to emit light (e.g., as an output beam) and define an emission wavelength range of the VCSEL device 100. For example, the active region 110 may include one or more quantum wells, such as at least one InP-based quantum well (e.g., at least one quantum well comprising InP and/or at least one of indium gallium arsenide phosphide (InGaAsP) and/or indium aluminum gallium arsenide (InAlGaAs), among other examples), and/or one or more quantum dot layers, such as at least one InP-based quantum dot layer (e.g., at least one quantum dot layer comprising InP and/or at least one of InGaAsP and/or InAlGaAS, among other examples). Accordingly, in some implementations, the active region 110 may be an InP-based active region.

The p-type layer 112 may be disposed over the active region 110. For example, the p-type layer 112 may be disposed on (e.g., directly on) a surface of the active region 110 or on one or more intervening layers or structures (e.g., one or more spacers, one or more cladding layers, and/or other examples) between the active region 110 and the p-type layer 112. The p-type layer 112 may comprise, for example, at least one p-doped semiconductor layer, such as a p-doped InP (p-InP) layer.

The tunnel junction 114 may be disposed over the p-type layer 112. For example, the tunnel junction 114 may be disposed on (e.g., directly on) a surface of the p-type layer 112 or on one or more intervening layers between the p-type layer 112 and the tunnel junction 114. In some implementations, the tunnel junction 114 may include a set of highly doped alternating semiconductor layers, such as a set of alternating highly n-doped semiconductor layers and highly p-doped semiconductor layers. For example, the tunnel junction 114 may include a set of alternating highly n-doped In-based layers (e.g., highly n-doped InP (n--InP) layers and/or highly n-doped InGaAs (n--InGaAs) layers), and highly p-doped In-based layers (e.g., highly p-doped InGaAlAs (p+-InGaAlAs) layers and/or highly p-doped InAlAs (p+-InAlAs) layers).

The second n-type layer 116 may be disposed over the tunnel junction 114. For example, the second n-type layer 116 may be disposed on (e.g., directly on) a surface of the tunnel junction 114 or on one or more intervening layers or structures (e.g., one or more spacers, one or more cladding layers, and/or other examples) between the tunnel junction 114 and the second n-type layer 116. Additionally, in some implementations, the second n-type layer 116 may be disposed over the p-type layer 112 (e.g., when the tunnel junction 114 is disposed over a particular portion of the tunnel junction 114). For example, the second n-type layer 116 may be disposed on (e.g., directly on) one or more other portions (e.g., that does not include the particular portion) of the surface of the p-type layer 112. The second n-type layer 116 may comprise, for example, at least one n-doped semiconductor layer, such as an n-doped InP (n-InP) layer.

The additional bonding layer 118 may be disposed over the second n-type layer 116. For example, the additional bonding layer 118 may be disposed on (e.g., directly on) a surface of the second n-type layer 116 or on one or more intervening layers or structures (e.g., one or more spacers, one or more cladding layers, and/or other examples) between the second n-type layer 116 and the additional bonding layer 118. The additional bonding layer 118 may comprise, for example, at least one of a polymer, such as an SU-8 photoresist polymer or a BCB polymer; a metal material; or an $SiO_2$ material. In some implementations, a thickness of the additional bonding layer 118 may be between a particular thickness range. For example, the thickness of the additional bonding layer 118 may be between 10 nanometers and 1.6 micrometers (e.g., greater than or equal to 10 nanometers and less than or equal to 1.6 micrometers). In some implementations, the additional bonding layer 118 may be configured to bond the second n-type layer 116 to the second mirror 120 (e.g., when the second mirror 120 is a semiconductor DBR, as described herein).

The second mirror 120 may be disposed over the additional bonding layer 118. For example, the second mirror 120 may be disposed on (e.g., directly on) a surface of the additional bonding layer 118 or on one or more intervening layers or structures (e.g., one or more spacers, one or more cladding layers, and/or other examples) between the additional bonding layer 118 and the second mirror 120. The second mirror 120 may include a reflector, such as a semiconductor DBR. For example, the second mirror 120 may include a set of alternating semiconductor layers, such as a set of alternating GaAs layers and AlGaAs layers or a set of alternating AlGaAs layers with different percentages of Al (e.g., AlGaAs layers with a low Al percentage and AlGaAs layers with a high Al percentage). In some implementations, the second mirror 120 may be an n-doped mirror (e.g., an n-doped DBR). For example, the second mirror 120 may include a set of alternating n-doped GaAs (n-GaAs) layers and n-doped AlGaAs (n-AlGaAs) layers or a set of alternating n-doped AlGaAs layers with a low Al percentage (low Al n-AlGaAs) and n-doped AlGaAs layers with a high Al percentage (high Al n-AlGaAs).

Alternatively, in some implementations, the second mirror 120 may include a dielectric DBR and, therefore, the additional bonding layer 118 may not be included in the VCSEL device 100 (e.g., because the additional bonding layer 118 is not needed to bond the second n-type layer 116 to the second mirror 120). Accordingly, the second mirror 120 may be disposed over the second n-type layer 116. For example, the second mirror 120 may be disposed on (e.g., directly on) a surface of the second n-type layer 116 or on one or more intervening layers or structures (e.g., one or more spacers, one or more cladding layers, and/or other examples) between the second n-type layer 116 and the second mirror 120.

The set of first contacts 122 may comprise one or more n-type contacts. In some implementations, each of the set of first contacts 122 may be disposed over the first n-type layer 108. For example, a first contact 122 (e.g., first contact 122-1 or first contact 122-2, as shown in FIG. 1A) may be disposed on (e.g., directly on) a surface of the first n-type layer 108 (e.g., a portion of the surface of the first n-type layer 108 on which the active region 110 is not disposed) or on one or more intervening layers (e.g., one or more spacers, one or more cladding layers, and/or other examples) between the first n-type layer 108 and the first contact 122. In some implementations, each of the set of first contacts 122 may be an n-doped semiconductor structure, such as an n-doped InP (n-InP) structure and/or an n-doped InAlAs (n-InAlAs) structure. Each of the set of first contacts 122 may facilitate an electrical connection with the VCSEL device 100.

The set of second contacts 124 may comprise one or more p-type contacts. In some implementations, each of the second contacts 124 may be disposed over the second n-type layer 116. For example, a second contact 124 (e.g., second contact 124-1 or second contact 124-2, as shown in FIG. 1A) may be disposed on (e.g., directly on) a surface of the second n-type layer 116 (e.g., a portion of the surface of the second n-type layer 116 on which the additional bonding layer 118 and/or the second mirror 120 is not disposed) or on one or more intervening layers (e.g., one or more spacers, one or more cladding layers, and/or other examples) between the second n-type layer 116 and the second contact 124. In some implementations, each of the set of second contacts 124 may be an n-doped semiconductor structure, such as an n-doped InP (n-InP) structure and/or an n-doped InAlAs (n-InAlAs) structure. Each of the set of second contacts 124 may facilitate an electrical connection with the VCSEL device 100.

In a second example configuration, as shown in FIG. 1B, the VCSEL device 100 may include the substrate 102, the first mirror 104, the bonding layer 106, the first n-type layer 108, the active region 110, the p-type layer 112, the tunnel junction 114, the second n-type layer 116, the additional bonding layer 118, the second mirror 120, the set of first contacts 122 (shown in FIG. 1B as first contacts 122-1 and 122-2), and/or the set of second contacts 124 (shown in FIG. 1B as second contacts 124-1 and 124-2). Additionally, the VCSEL device 100 may include a set of vias 126 (shown in FIG. 1B as via 126-1 and 126-2) and/or a metal layer 128.

As shown in FIG. 1B, the set of vias 126 may each be formed in the substrate 102, the first mirror 104, the bonding layer 106, and the first n-type layer 108. In some implementations, a first contact 122, of the set of first contacts 122, may be disposed within an interior portion of a via 126, of the set of vias 126. For example, as shown in FIG. 1B, a first contact 122 (e.g., first contact 122-1 or first contact 122-2) may be disposed on one or more interior walls of a corresponding via 126 (e.g., via 126-1 or via 126-2) such that the first contact 122 contacts the substrate 102, the first mirror 104, the bonding layer 106, and the first n-type layer 108.

As further shown in FIG. 1B, the metal layer 128 may be disposed over the substrate 102. For example, the metal layer 128 may be disposed on (e.g., directly on) a surface of the substrate 102 (e.g., on a surface different than the surface on which the first mirror 104 is disposed) or on one or more intervening layers or structures (e.g., one or more spacers, one or more cladding layers, and/or other examples) between the substrate 102 and the metal layer 128. The metal layer 128 may comprise a metal layer, such as a gold (Au) layer, and/or a metal alloy layer, such as a gold-zinc (Au—Zn) layer, among other examples, through which electrical current may flow. In some implementations, the metal layer 128 may be n-doped and may be configured as a cathode (e.g., an n-metal cathode) for the VCSEL device 100 (e.g., when the substrate 102 is an n-doped substrate and the VCSEL device is configured as shown in FIG. 1B).

In some implementations, multiple VCSEL devices may be included in a single die (e.g., a die that comprises an array of VCSEL devices). For example, the die may include a plurality of VCSEL devices that share a common substrate 102. That is, the die may comprise the substrate 102 and may comprise, disposed on respective regions of a surface of the substrate 102, individual epitaxial structures that include the first mirror 104, the bonding layer 106, the first n-type layer 108, the active region 110, the p-type layer 112, the tunnel junction 114, the second n-type layer 116, the additional bonding layer 118, the second mirror 120, the set of first contacts 122, and/or the set of second contacts 124 arranged in a same or similar configuration as described herein in relation to FIGS. 1A-1B. In some implementations, each epitaxial structure includes the set of vias 126, and the metal layer 128 may be disposed over a surface of the common substrate 102 (e.g., that is different than the surface of the common substrate 102 on which the individual epitaxial structures are disposed) in a similar manner as described herein in relation to FIG. 1B.

As indicated above, FIGS. 1A-1B are provided as an example. Other examples may differ from what is described with regard to FIGS. 1A-1B. In practice, the VCSEL device 100 (and a die that includes multiple VCSEL devices) may include additional layers and/or structures, fewer layers and/or structures, different layers and/or structures, or differently arranged layers and/or structures than those shown in FIGS. 1A-1B. Further, in some implementations, structures and layers shown in FIGS. 1A-1B are respectively shown as continuously formed over other structures and layers and having a uniform thickness. In practice, the structures and layers may be non-continuously formed over other structures and layers and/or may have non-uniform thicknesses.

Figure 2A:
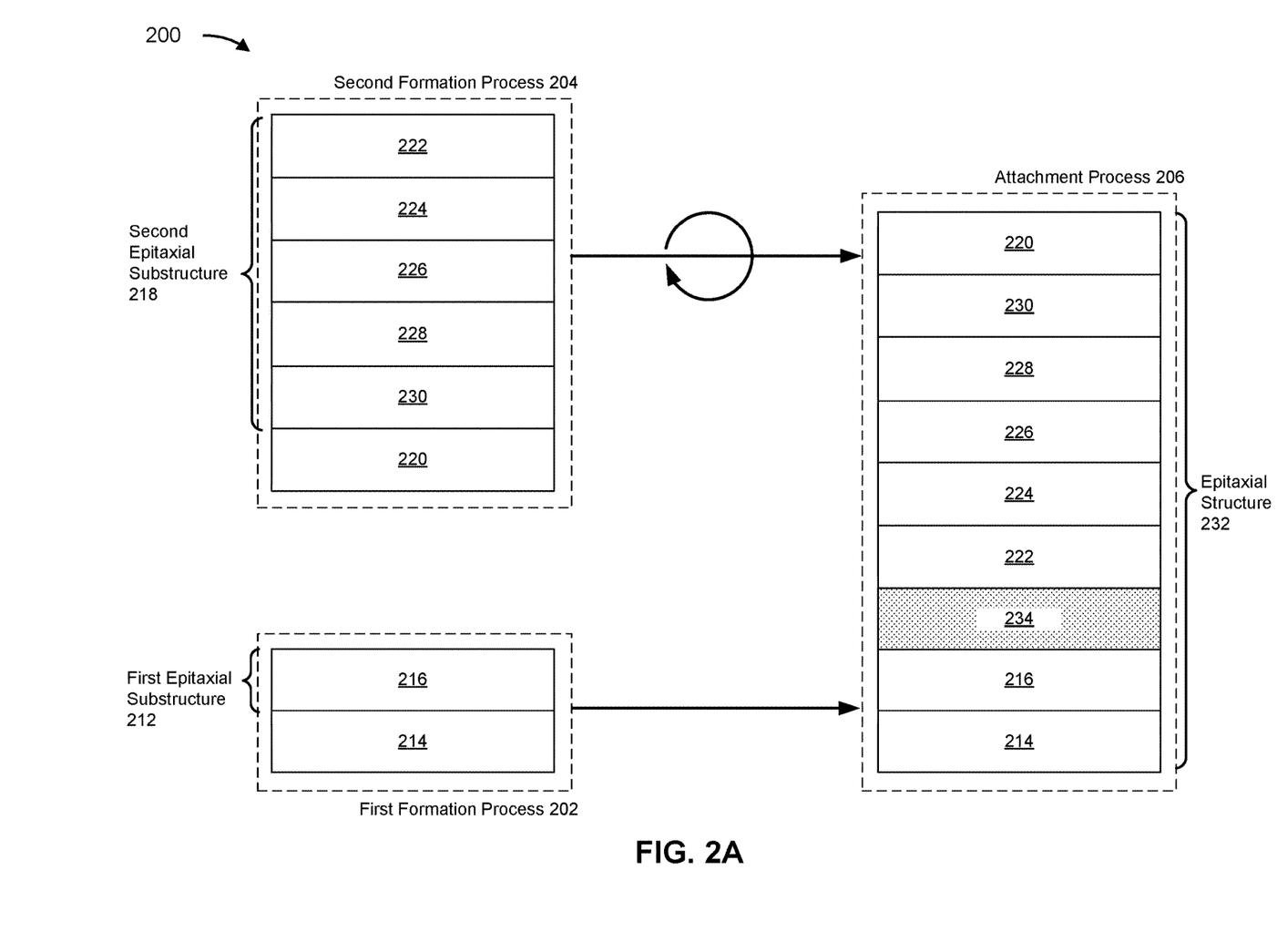
FIGS. 2A-2B are diagrams of an example implementation of a multistage process for forming a VCSEL device described herein.
Figure 2B:
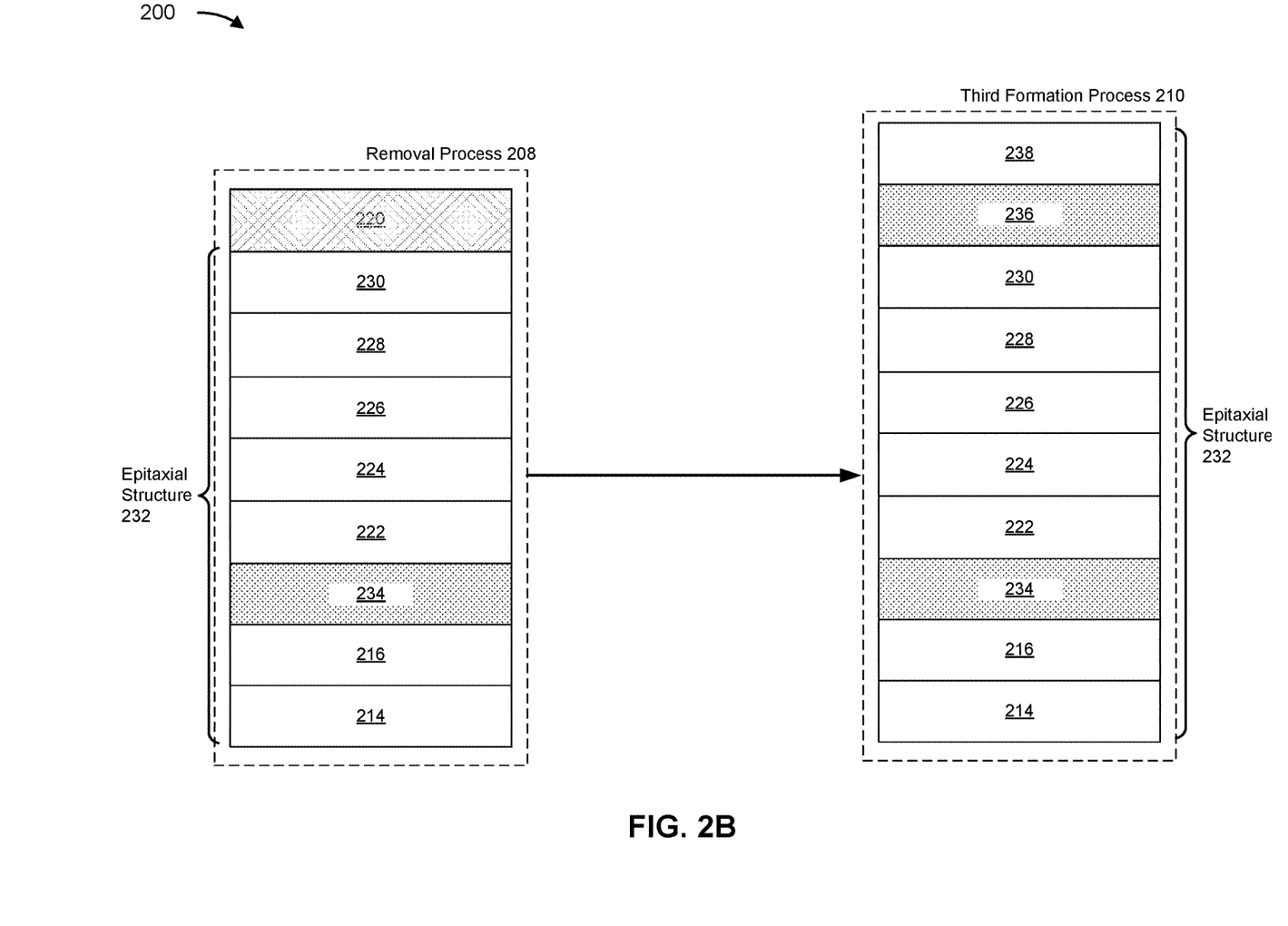

FIGS. 2A-2B are diagrams of an example implementation 200 of a multistage process for forming a VCSEL device (e.g., a VCSEL device that is the same as, or similar to, the VCSEL device 100 described herein in relation to FIGS. 1A-1B). As shown in FIGS. 2A-2B, the multistage process may include a first formation process 202, a second formation process 204, an attachment process 206, a removal process 208, and/or a third formation process 210.

As shown in FIG. 2A, the multistage process includes forming a first epitaxial substructure 212 on a substrate 214 (e.g., that is the same as, or similar to, the substrate 102 described herein in relation to FIGS. 1A-1B) during the first formation process 202. The first formation process 202 may include, for example, a molecular beam epitaxy (MBE) process, a metal-organic chemical vapor deposition (MOCVD) process, and/or another similar formation process. As shown in FIG. 2A, the first epitaxial substructure 212 may include a first mirror 216 (e.g., that is the same as, or similar to, the first mirror 104 described herein in relation to FIGS. 1A-1B). Accordingly, the first formation process 202 may be used to form the first mirror 216 over the substrate 214.

As further shown in FIG. 2A, the multistage process includes forming a second epitaxial substructure 218 on a substrate 220 during the second formation process 204. The second formation process 204 may include, for example, an MBE process, an MOCVD process, and/or another similar formation process. The substrate 220 may include a substrate upon which the second epitaxial substructure 218 is formed. The substrate 220 may include a semiconductor material, such as GaAs, InP, Ge, and/or another type of semiconductor material. In some implementations, the substrate 220 may be an n-doped substrate, such as an n-type GaAs substrate, an n-type InP substrate, or an n-type Ge substrate. As further shown in FIG. 2A, the second epitaxial substructure 218 may include a first n-type layer 222, an active region 224, a p-type layer 226, a tunnel junction 228, and/or a second n-type layer 230 (e.g., that are respectively the same as, or similar to, the first n-type layer 108, the active region 110, the p-type layer 112, the tunnel junction 114, and/or the second n-type layer 116 described herein in relation to FIGS. 1A-1B). Accordingly, the second formation process 204 may be used to form the second n-type layer 230 over the substrate 220, the tunnel junction 228 over the second n-type layer 230, the p-type layer 226 over the tunnel junction 228, the active region 224 over the p-type layer 226, and/or the first n-type layer 222 over the active region 224.

In some implementations, the first formation process 202 and the second formation process 204 may be performed contemporaneously (e.g., some or all of the first formation process 202 may be performed when the second formation process 204 is performed) or separately (e.g., the first formation process 202 may be performed prior to performance of the second formation process 204, or vice versa).

As further shown in FIG. 2A, the multistage process includes forming an epitaxial structure 232 by attaching the first epitaxial substructure 212 to the second epitaxial substructure 218 during the attachment process 206. The attachment process 206 may include orientating the first epitaxial substructure 212 to the second epitaxial substructure 218 to cause a "top" surface of the first epitaxial substructure 212 (e.g., a surface of the first mirror 216) to face a "top" surface of the second epitaxial substructure 218 (e.g., a surface of the first n-type layer 222). For example, as shown in FIG. 2A, the second epitaxial substructure 218 may be "turned" or "flipped" to cause the surface of the first mirror 216 of the first epitaxial substructure 212 to face the surface of the first n-type layer 222 of the second epitaxial substructure 218. In an additional, or alternative, example, the first epitaxial substructure 212 may be "turned" or "flipped" to cause the surface of the first mirror 216 of the first epitaxial substructure 212 to face the surface of the first n-type layer 222 of the second epitaxial substructure 218.

In some implementations, the attachment process 206 may include cleaning a surface of the first epitaxial substructure 212. For example, the attachment process 206 may include cleaning the surface of the first mirror 216 of the first epitaxial substructure 212 using a spin cleaning process, a plasma cleaning process, an etching process, or a similar process. As further shown in FIG. 2A, the attachment process 206 may include forming a bonding layer 234 (e.g., that is the same as, or similar to, the bonding layer 106 described herein in relation to FIGS. 1A-1B) on the surface of first epitaxial substructure 212. For example, the attachment process 206 may include spin coating the surface of the first mirror 216 with the bonding layer 234 (e.g., after cleaning the surface of the first mirror 216). Further, the attachment process 206 may include disposing the second epitaxial substructure 218 on the bonding layer 234. For example, the attachment process 206 may include disposing the surface of the first n-type layer 222 of the second epitaxial substructure 218 (e.g., after "turning" or "flipping" the second epitaxial substructure 218) on the bonding layer 234. In this way, the first epitaxial substructure 212 may be attached to the second epitaxial substructure 218 to form the epitaxial structure 232.

Alternatively, in some implementations, the attachment process 206 may include cleaning a surface of the second epitaxial substructure 218. For example, the attachment process 206 may include cleaning the surface of the first n-type layer 222 of the second epitaxial substructure 218 using a spin cleaning process, a plasma cleaning process, an etching process, or a similar process. The attachment process 206 then may include forming the bonding layer 234 on the surface of the second epitaxial substructure 218. For example, the attachment process 206 may include spin coating the surface of the first n-type layer 222 with the bonding layer 234 (e.g., after cleaning the surface of the first n-type layer 222). Further, the attachment process 206 may include disposing the first epitaxial substructure 212 on the bonding layer 234. For example, the attachment process 206 may include disposing the surface of the first mirror 216 of the first epitaxial substructure 212 (e.g., after "turning" or "flipping" the first epitaxial substructure 212) on the bonding layer 234. In this way, the first epitaxial substructure 212 may be attached to the second epitaxial substructure 218 to form the epitaxial structure 232.

In some implementations, after disposing the first epitaxial substructure 212 or the second epitaxial substructure 218 on the bonding layer 234, the attachment process 206 may include applying compressive pressure on the first epitaxial substructure 212 and/or the second epitaxial substructure 218. For example, the attachment process 206 may include pushing at least one of the first epitaxial substructure 212 or the second epitaxial substructure 218 towards the other when the bonding layer 234 is drying, curing, and/or setting. Additionally, or alternatively, after disposing the first epitaxial substructure 212 or the second epitaxial substructure 218 on the bonding layer 234, the attachment process 206 may include applying heat to at least one of the first epitaxial substructure 212, the second epitaxial substructure 218, or the bonding layer 234. For example, the attachment process 206 may include applying heat, wherein a temperature of the applied heat is within a range of 100 to 200 degrees Celsius (e.g., greater than or equal to 100 degrees Celsius and less than or equal to 200 degrees Celsius). In this way, the attachment process 206 may cause the first epitaxial substructure 212 to bond to the second epitaxial substructure 218 (or may increase a strength of the bond between the first epitaxial substructure 212 and the second epitaxial substructure 218) to form the epitaxial structure 232. Further, this may improve a durability and/or a structural integrity of the epitaxial structure 232.

After completion of the attachment process 206, as further shown in FIG. 2A, the epitaxial structure 232 may include the first mirror 216 formed over the substrate 214, the bonding layer 234 formed over the first mirror 216, the first n-type layer 222 formed over the bonding layer 234, the active region 224 formed over the first n-type layer 222, the p-type layer 226 formed over the active region 224, the tunnel junction 228 formed over the p-type layer 226, the second n-type layer 230 formed over the tunnel junction 228, and the substrate 220 formed over the second n-type layer 230.

As shown in FIG. 2B, the multistage process may include removing a portion of the epitaxial structure 232 during the removal process 208. In some implementations, the removal process 208 may include removing the substrate 220 from the epitaxial structure 232. For example, the removal process 208 may include removing the substrate 220 from the epitaxial structure 232 using an etching process (e.g., that includes etching the substrate 220 to remove the substrate 220 from the epitaxial structure 232).

As further shown in FIG. 2B, the multistage process may include forming an additional bonding layer 236 and/or a second mirror 238 (e.g., that are respectively the same as, or similar to, the additional bonding layer 118 and/or the second mirror 120 described herein in relation to FIGS. 1A-1B) over the epitaxial structure 232 during the third formation process 210.

In an example, such as when the second mirror 238 is a semiconductor DBR, the third formation process 210 may be used to form the additional bonding layer 236 and the second mirror 238 over the epitaxial structure 232. Accordingly, the third formation process 210 may include forming the additional bonding layer 236 on a surface of the epitaxial structure 232 (e.g., the surface of the epitaxial structure 232 that was exposed by removing the substrate 220 from the epitaxial structure 232). For example, the attachment process 206 may include spin coating a surface of the second n-type layer 230 with the additional bonding layer 236 (e.g., after cleaning the surface of the second n-type layer 230 in a similar manner as elsewhere described herein). Further, the third formation process 210 may include forming the second mirror 238 on the additional bonding layer 236. For example, the third formation process 210 may include using an MBE process, an MOCVD process, and/or another similar formation process to form the second mirror 238 on a surface of the additional bonding layer 236. In this way, the second mirror 238 may be attached to the epitaxial structure 232. In some implementations, the third formation process 210 includes applying compressive pressure and/or heat may to the epitaxial structure 232 in a similar manner as that described elsewhere herein. In this way, the third formation process 210 may cause the second mirror 238 to bond to the second n-type layer 230 (or may increase a strength of the bond between the second mirror 238 to bond to the second n-type layer 230) to modify the epitaxial structure 232. Further, this may improve a durability and/or a structural integrity of the epitaxial structure 232.

As an alternative example, such as when the second mirror 238 is a semiconductor DBR, the third formation process 210 may be used to form the second mirror 238 over the epitaxial structure 232 (e.g., without formation of the additional bonding layer 236). Accordingly, the third formation process 210 may include forming the second mirror 238 on the surface of the second n-type layer 230. For example, the third formation process 210 may include using an MBE process, an MOCVD process, and/or another similar formation process to form the second mirror 238 on the surface of the second n-type layer 230. In this way, the second mirror 238 may be formed over the second n-type layer 230 and therefore may be included in the epitaxial structure 232.

In some implementations, the multistage process may include one or more additional processes. For example, after completion of the third formation process 210, an additional formation process (e.g., that includes using an MBE process, an MOCVD process, and/or another similar formation process) may be used to form a set of first contacts and/or a set of second contacts (e.g., that are respectively the same as, or similar to, the set of first contacts 122 and/or the set of second contacts 124 described herein in relation to FIGS. 1A-1B) on the epitaxial structure 232. The additional formation process may include, for example, forming the set of first contacts on respective portions of a surface the first n-type layer 222 and/or forming the set of second contacts on respective portions of a surface of the second n-type layer 230.

As an alternative example, after completion of the third formation process 210, another additional formation process (e.g., that includes using an MBE process, an MOCVD process, and/or another similar formation process; that includes using an etching process; that includes a metallization process; and/or other another process) may be used to form a set of vias, a set of first contacts, a set of second contacts, and/or a metal layer (e.g., that are respectively the same as, or similar to, the set of vias 126, the set of first contacts 122, the set of second contacts 124, and/or the metal layer 128 described herein in relation to FIGS. 1A-1B) on the epitaxial structure 232. The other additional formation process may include etching the set of vias in the epitaxial structure 232 (e.g., where each via is formed in the substrate 214, the first mirror 216, the bonding layer 234, and the first n-type layer 222 of the epitaxial structure 232) and respectively forming the set of first contacts within the set of vias. The other additional formation process may include forming the set of second contacts on respective portions of a surface of the second n-type layer 230 and/or forming the metal layer on a surface of the substrate 214 (e.g., a surface of the substrate 214 on which the epitaxial structure 232 is not disposed).

As indicated above, FIGS. 2A-2B are provided as an example. Other examples may differ from what is described with regard to FIGS. 2A-2B. In practice, the multistage process may include forming additional layers and/or structures, fewer layers and/or structures, different layers and/or structures, or differently arranged layers and/or structures than those shown in FIGS. 2A-2B.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "bottom," "above," "upper," "top," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. A vertical cavity surface emitting laser (VCSEL) device, comprising:
    a substrate;
    a first mirror disposed over the substrate;
    a bonding layer disposed over the first mirror;
    a first n-type layer disposed directly over the bonding layer;
    an active region disposed directly over the first n-type layer, wherein:
        the substrate is a gallium arsenide (GaAs) substrate, and
        the active region is an indium phosphide (InP)-based active region;
    a p-type layer disposed directly over the active region;
    a second n-type layer disposed over the active region;
    a tunnel junction disposed between the second n-type layer and the active region,
        wherein the tunnel junction overlaps a portion of the p-type layer and a portion of the second n-type layer;
    a second mirror disposed over the second n-type layer;
    a set of first contacts below the tunnel junction; and
    a set of second contacts disposed on the second n-type layer and adjacent to the second mirror.

2. The VCSEL device of claim 1, wherein the VCSEL device is configured to emit an output beam,
    wherein a wavelength of the output beam is in a range of 1200-1600 nanometers.

3. The VCSEL device of claim 1, wherein the VCSEL device comprises at least one of:

a short-wave infrared (SWIR) VCSEL device;
an oxide confined VCSEL device;
an implant confined VCSEL device;
a mesa confined VCSEL device;
a top emitting VCSEL device; or
a bottom emitting VCSEL device.

4. The VCSEL device of claim 1, wherein the bonding layer comprises at least one of:
an SU-8 photoresist polymer;
a benzocyclobutene (BCB) polymer;
a metal material; or
a silicon dioxide ($SiO_2$) material.

5. The VCSEL device of claim 1, wherein a thickness of the bonding layer is between 10 nanometers and 1.6 micrometers.

6. The VCSEL device of claim 1, further comprising:
one or more additional layers disposed over the active region;
an additional bonding layer disposed over the one or more additional layers; and
a second mirror disposed over the additional bonding layer.

7. The VCSEL device of claim 1, further comprising:
one or more vias formed in the substrate, the first mirror, and the bonding layer,
wherein the set of first contacts is disposed within an interior portion of the one or more vias, and
wherein the set of first contacts contact the substrate, the first mirror, the bonding layer, and the first n-type layer.

8. The VCSEL device of claim 1, further comprising:
a metal layer disposed over the substrate, wherein:
the first mirror is disposed on a surface of the substrate, and
the metal layer is disposed on a different surface of the substrate.

9. The VCSEL device of claim 1, further comprising:
one or more vias formed in a portion of the first mirror that does not overlap vertically with the second mirror.

10. A die, comprising:
a gallium arsenide (GaAs) substrate; and
a plurality of individual epitaxial structures disposed on the substrate,
wherein each epitaxial structure, of the plurality of individual epitaxial structures, comprises:
a first mirror disposed over the substrate;
a bonding layer disposed over the first mirror;
a first n-type layer disposed directly over the bonding layer;
an indium phosphide (InP)-based active region disposed directly over the first n-type layer;
a p-type layer disposed directly over the active region;
a second n-type layer disposed over the active region;
a tunnel junction disposed between the second n-type layer and the active region,
wherein the tunnel junction overlaps a portion of the p-type layer and a portion of the second n-type layer;
a second mirror disposed over the second n-type layer;
a set of first contacts below the tunnel junction; and
a set of second contacts on the second n-type layer adjacent to the second mirror.

11. The die of claim 10, wherein the bonding layer comprises at least one of:
an SU-8 photoresist polymer;
a benzocyclobutene (BCB) polymer;
a metal material; or
a silicon dioxide ($SiO_2$) material.

12. The die of claim 10, wherein the first mirror is a semiconductor distributed Bragg reflector (DBR) that comprises at least one of:
a set of alternating GaAs layers and aluminum gallium arsenide (AlGaAs) layers, or
a set of alternating AlGaAs layers with different percentages of Al.

13. The die of claim 10, wherein the active region includes at least one of:
at least one InP-based quantum well; or
at least one InP-based quantum dot layer.

14. The die of claim 10, further comprising:
a metal layer disposed on the substrate, wherein:
the plurality of individual epitaxial structures are disposed on a surface of the substrate, and
the metal layer is disposed on a different surface of the substrate.

15. The die of claim 10, wherein the epitaxial structure further comprises:
one or more vias formed in the first mirror and the bonding layer,
wherein the set of first contacts is disposed within an interior portion of the one or more vias, and
wherein the set of first contacts contact the substrate, the first mirror, the bonding layer, and the first n-type layer.

16. A method of forming a vertical cavity surface emitting laser (VCSEL) device, comprising:
forming a first epitaxial substructure on a gallium arsenide (GaAs) substrate;
forming a second epitaxial substructure on an indium phosphide (InP) substrate;
attaching, using a bonding layer, the first epitaxial substructure to the second epitaxial substructure to form an epitaxial structure; and
removing the InP substrate from the epitaxial structure,
wherein the VCSEL device comprises:
a first mirror disposed over the GaAS substrate;
the bonding layer disposed over the first mirror;
a first n-type layer disposed directly over the bonding layer;
an active region disposed directly over the first n-type layer;
a p-type layer disposed directly over the active region;
a second n-type layer disposed over the active region;
a tunnel junction disposed between the second n-type layer and the active region,
wherein the tunnel junction overlaps a portion of the p-type layer and a portion of the second n-type layer;
a second mirror disposed over the second n-type layer;
a set of first contacts below the tunnel junction; and
a set of second contacts disposed on the second n-type layer and adjacent to the second mirror.

17. The method of claim 16, wherein:
the first epitaxial substructure includes the first mirror; and
the second epitaxial substructure includes the active region that is an InP-based active region.

18. The method of claim 16, wherein attaching the first epitaxial substructure to the second epitaxial substructure to form the epitaxial structure comprises:
- forming the bonding layer on a surface of the first epitaxial substructure; and
- disposing a surface of the second epitaxial substructure on the surface of the first epitaxial substructure.

19. The method of claim 16, further comprising:
- forming, after removing the InP substrate from the epitaxial structure, an additional bonding layer on a surface of the epitaxial structure; and
- forming the second mirror on a surface of the additional bonding layer.

20. The method of claim 16, wherein the VCSEL device further comprises:
- one or more vias formed in the first mirror and the bonding layer,
    - wherein the set of first contacts is disposed within an interior portion of the one or more vias, and
    - wherein the set of first contacts contact the GaAS substrate, the first mirror, the bonding layer, and the first n-type layer.

\* \* \* \* \*